United States Patent
Roellgen et al.

(10) Patent No.: US 9,019,042 B2
(45) Date of Patent: Apr. 28, 2015

(54) HIGH-FREQUENCY SWINGING CHOKE

(75) Inventors: Bernhard Roellgen, Munich (DE); Herbert-Maurizio Cardarelli, Munich (DE)

(73) Assignee: Epcos AG, Munich (DE)

( * ) Notice: Subject to any disclaimer, the term of this patent is extended or adjusted under 35 U.S.C. 154(b) by 604 days.

(21) Appl. No.: 13/148,466

(22) PCT Filed: Feb. 9, 2010

(86) PCT No.: PCT/EP2010/051578
§ 371 (c)(1),
(2), (4) Date: Sep. 28, 2011

(87) PCT Pub. No.: WO2010/089413
PCT Pub. Date: Aug. 12, 2010

(65) Prior Publication Data
US 2012/0007695 A1    Jan. 12, 2012

(30) Foreign Application Priority Data
Feb. 9, 2009    (DE) .......................... 10 2009 008 110

(51) Int. Cl.
*H03H 7/01*   (2006.01)
*H01F 17/04*  (2006.01)
*H01F 41/12*  (2006.01)
*H01F 3/10*   (2006.01)
*H01F 27/34*  (2006.01)

(52) U.S. Cl.
CPC ............... *H01F 41/127* (2013.01); *H03H 7/01* (2013.01); *H01F 3/10* (2013.01); *H01F 17/045* (2013.01); *H01F 27/346* (2013.01); *H01F 2017/048* (2013.01)

(58) Field of Classification Search
CPC ....... H01F 17/04; H01F 41/06; H01F 17/045; H01F 4/127; H01F 3/10; H01F 27/346; H01F 2017/048; H03H 7/0115; H03H 7/09; H03H 1/0007; H03H 7/01
USPC ...................... 333/171, 175, 181; 336/90, 178
See application file for complete search history.

(56) References Cited

U.S. PATENT DOCUMENTS

| | | | |
|---|---|---|---|
| 2003/0160675 | A1 | 8/2003 | Von Der Weth et al. |
| 2004/0136559 | A1* | 7/2004 | Suzuki .......................... 381/400 |
| 2006/0244398 | A1 | 11/2006 | Kitamura et al. |
| 2011/0068886 | A1 | 3/2011 | Roellgen et al. |

FOREIGN PATENT DOCUMENTS

| | | | | |
|---|---|---|---|---|
| CN | 2370599 Y | 3/2000 | | |
| DE | 920 856 C | 12/1954 | | |
| DE | 101 04 648 A1 | 1/2002 | | |
| DE | 10 2007 007 117 A1 | 8/2008 | | |
| DE | 102007007117 | * 8/2008 | ............. | H01F 17/04 |
| DE | 10 2008 016 488 A1 | 10/2009 | | |
| EP | 1 895 549 A1 | 3/2008 | | |
| GB | 1105486 A | 3/1968 | | |
| JP | 04-359502 A | 12/1992 | | |
| JP | 05-021230 A | 1/1993 | | |

(Continued)

*Primary Examiner* — Benny Lee
*Assistant Examiner* — Jorge Salazar, Jr.
(74) *Attorney, Agent, or Firm* — Slater & Matsil, L.L.P.

(57) ABSTRACT

A high-frequency swinging choke has at least two rod cores arranged next to one another in the longitudinal direction. The rod cores each have at least one winding. The windings are connected in series.

20 Claims, 3 Drawing Sheets

(56) References Cited

FOREIGN PATENT DOCUMENTS

| JP | 2000-124034 A | 4/2000 |
| JP | 2004-259794 A | 9/2004 |
| JP | 2005-176599 A | 6/2005 |
| JP | 2006310648 A | 11/2006 |
| JP | 2007-235580 A | 9/2007 |
| WO | WO 98/43255 A1 | 10/1998 |
| WO | 03039211 A1 | 5/2003 |
| WO | WO 2010/089413 A1 | 8/2010 |

* cited by examiner

HIGH-FREQUENCY SWINGING CHOKE

This patent application is a national phase filing under section 371 of PCT/EP2010/051578, filed Feb. 9, 2010, which claims the priority of German patent application 10 2009 008 110.0, filed Feb. 9, 2009, each of which is incorporated herein by reference in its entirety.

BACKGROUND

A high-frequency swinging choke is disclosed in European Patent publication EP 1405322 B1.

SUMMARY

In one aspect, a high-frequency swinging choke which has low losses.

A high-frequency swinging choke which has at least two rod cores arranged next to one another in the longitudinal direction is specified. In a preferred embodiment, the rod cores are arranged virtually parallel to one another.

The rod cores each have at least one winding. Preferably, the rod cores each have a length which extends at least beyond the length of the winding. The rod cores preferably have a winding-free region at the respective ends.

The windings are preferably connected in series.

In an embodiment, the winding directions of the at least two windings are aligned in opposition to one another. Preferably, the flow directions of the magnetic fields which are induced by the windings of two adjacent windings are aligned in opposition to one another.

In a further embodiment in which the high-frequency swinging choke has more than two windings, the adjacent windings preferably have opposing winding directions. The flow directions of the magnetic fields induced by the windings preferably have alternate opposing directions.

In operation, the magnetic fields of the high-frequency swinging choke induced in the swinging choke form at least one closed magnetic circuit.

In an embodiment, the magnetic circuit of the high-frequency swinging choke has at least one air gap.

In an embodiment, the air gap of the high-frequency swinging choke is divided into at least two partial air gaps. The partial air gaps are preferably located in the region of the winding-free ends of at least two adjacent rod cores.

In an embodiment, the windings are arranged on the rod cores in such a way that only part of the rod cores is encompassed by the windings in the longitudinal direction.

In an embodiment, at least 50% of the length of a rod core is encompassed by the winding.

Preferably, the at least two rod cores of the high-frequency swinging choke are encompassed by windings over a length of more than 50% of the length of the rod cores in each case.

In an embodiment of the high-frequency swinging choke, the windings have different lengths. The length of the winding is understood to mean the length dimension of the winding in the wound state.

In an embodiment of the high-frequency swinging choke with three rod cores and three windings, two of the windings can have the same length and a third winding a greater or shorter length. It is also possible that the three windings each have different lengths. In an embodiment with three adjacent rod cores, the middle rod core preferably has larger dimensions than the outer rod cores.

In an embodiment, the windings of the high-frequency swinging choke have a protective coating made of plastic.

The protective plastic coating is preferably designed in such a way that the winding-free ends of the rod cores are free from the protective plastic coating. In a further embodiment, however, it is also possible that the winding-free ends of the rod cores are encased by a protective plastic coating. Preferably, at least connecting contacts of the high-frequency swinging choke are at least partially free from a protective coating in order to enable a connection to be made.

In an embodiment of the high-frequency swinging choke, the free ends of the winding are designed as solder contacts. In a further embodiment, solder tags or other devices for electrical contact or for making an electrical connection to the high-frequency swinging choke are arranged on the ends of the windings.

In an embodiment, the high-frequency swinging choke preferably has approximately the maximum flux density of the rod cores at a maximum of one third of the saturation magnetization of the rod cores.

In an embodiment of the high-frequency swinging choke, at least 50% of the effective magnetic length of the rod core is used to form the magnetic field of the choke.

In an embodiment, the rod cores contain ferrite. The rod cores can, however, also contain other suitable materials.

In an embodiment, the windings are preferably wound on the rod cores in such a way that the windings have a plurality of winding layers that in each case are at a constant distance from the winding axis of the windings over the whole length of the windings.

In an embodiment, the high-frequency swinging choke is encased with a casting compound.

The high-frequency swinging choke has a closed magnetic circuit which includes a large air gap. With the high-frequency swinging choke described above, the air gap is arranged outside the windings. Such an arrangement enables the losses caused by stray fields to be kept low.

As a result of the structure of a high-frequency swinging choke described above, a small amount of ferrite material is required for the rod cores in comparison with a choke with a double-E core. This material is only utilized to a small extent. In the case of ferrite rod cores for chokes, the core losses increase at least quadratically up to a maximum of cubically with the magnetization of the rod cores. In contrast, air gap and clearances have no losses. As a result of optimized rod cores, the high-frequency swinging choke has only comparatively minimal losses.

The high-frequency swinging choke described above has at least two windings with a high number of turns, at least one large air gap divided into two partial air gaps, and relatively short rod cores containing ferrite. As a result of a structure of this kind, the maximum flux density in the ferrite-containing rod core can be kept well below the saturation magnetization. The saturation magnetization at the maximum flux density is about one third of the maximum saturation. A high-frequency swinging choke of this kind has relatively small thermal losses.

The high-frequency swinging choke is advantageous for applications in which a high inductance is required, as it has a high number of turns.

In an embodiment, the windings of the high-frequency swinging choke are designed as conventional wound coils.

In a preferred embodiment, all layers of a winding are wound together.

Reference is made to the content of German patent document DE 10 2008 016 488 with regard to the structure of the windings. The disclosure in full is incorporated herein by reference. This German patent document is a counterpart of U.S. Patent Application Pub. No. 2011/068886.

As a result of this structure of the winding, the high-frequency swinging choke has low losses due to skin and proximity effects at high frequencies.

As a result of this structure of the winding, when used in a series resonant circuit, the high-frequency swinging choke has a high voltage which is distributed over the whole length of the windings. As a result of its structure, the high-frequency swinging choke does not have significantly higher turn voltages at any point on the windings than the ignition voltage referred to the total number of turns.

In an exemplary embodiment of the high-frequency swinging choke, the rod cores each have a diameter of 11 mm and a length of 35 mm. The rod cores each have a winding which is 19 mm long. The windings have an inside diameter of 13 mm and have 8 layers of wire. The wires are designed in the form of stranded wires which are in each case formed by 8 individual wires with a diameter of 0.07 mm which are twisted against one another. The windings each have 55 turns. The figures specified here are only given by way of example. The high-frequency swinging choke is not restricted to this special exemplary embodiment.

In order to cast the casting compound around the high-frequency swinging choke, a device for encapsulating the high-frequency swinging choke, which comprises a casting container, is specified. The casting container is designed in such a way that the rod cores and the windings of the high-frequency swinging choke are fixed in the casting container. The casting container has at least two pairs of retaining devices which retain the rod cores and the windings of the high-frequency swinging choke in their specified position during casting so that all components of a series preferably have the same inductance.

The casting container preferably has an internal contour which determines the external shape of the encapsulated high-frequency swinging choke.

In order that no partial discharges or flashovers to the rod cores occur with the high-frequency swinging choke, the high-frequency swinging choke is impregnated with a liquid plastic or a liquid resin or encapsulated therewith. For this purpose, the high-frequency swinging choke is fixed in the device described above and impregnated and/or encapsulated in a vacuum chamber. During impregnation and encapsulation, the air between the individual turns of the windings is preferably completely displaced by the casting compound or by impregnation fluid. Partial discharges and/or flashovers to the rod cores are effectively suppressed or effectively reduced by the impregnation and encapsulation of the high-frequency swinging choke.

As a result of the structure of the high-frequency swinging choke and due to the subsequent impregnation and/or subsequent encapsulation of the high-frequency swinging choke, this high-frequency swinging choke has only small losses. Losses which occur when the high-frequency swinging choke resonates can therefore be effectively reduced.

Preferably, the high-frequency swinging choke is used in a circuit arrangement with an LC series resonant circuit in which a high utilization with high quality of the high-frequency swinging choke is required. Here, the high-frequency swinging choke is preferably energized with odd-numbered harmonics, wherein the harmonics include at least the third order. When energized with the third harmonic of a rectangular oscillation, only one third of the applied amplitude voltage of the fundamental is available, for example, so that, when used in an LC series resonant circuit, the high-frequency swinging choke generates a high voltage due to the high quality.

BRIEF DESCRIPTION OF THE DRAWINGS

The subject matter described above is explained in more detail with reference to the following figures and exemplary embodiments.

The drawings described below are not to scale. In fact, the diagrams may be shown enlarged, reduced or even distorted in individual dimensions. Elements which are the same as one another or which undertake the same function are designated with the same references.

Figure 1:
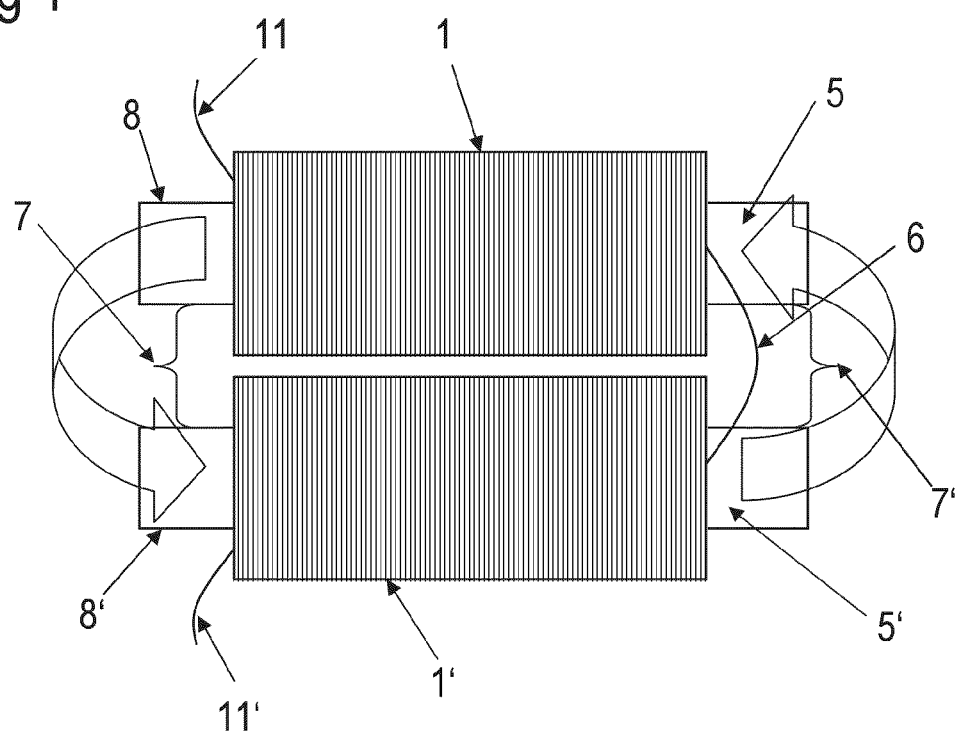
FIG. 1 shows a schematic structure of a first exemplary embodiment of a high-frequency swinging choke with two rod cores.

The following list of reference symbols may be used in conjunction with the drawings:

1, 1', 1" Winding
2, 2' Winding layer
3 Winding axis
4 Electrical contacts
5, 5', 5" Rod core
6, 6' Wire bridge
7, 7' Partial air gap
8, 8' Free end of the rod core 5
9 Casting container
10 Internal contour of the casting container 9
11, 11' Connecting contacts
A Section
d Distance from a winding layer 2, 2' to the winding axis 3
D1 Inside diameter of the winding 1

DETAILED DESCRIPTION OF ILLUSTRATIVE EMBODIMENTS

A schematic structure of an embodiment of a high-frequency swinging choke which has two adjacent rod cores 5, 5' is shown in FIG. 1. The rod cores 5, 5' each have a winding 1, 1'. The windings 1, 1' are connected in series by means of a wire bridge 6. The rod cores 5, 5' each have free ends 8, 8' which are free from windings 1, 1'. In the region of the free ends 8, 8' of the rod cores 5, 5', in each case the magnetic circuit of the high-frequency swinging choke has an air gap which is divided into two partial air gaps 7, 7' at the respective free ends 8, 8' of the rod cores 5, 5'. In the embodiment, the flow direction of the magnetic field of the high-frequency swinging choke is shown by the arrows at the respective free ends 8, 8' of the rod cores 5, 5'. In the embodiment shown, the flow direction is aligned in a clockwise direction. The high-frequency swinging choke has connecting contacts 11, 11' for making electrical contact.

Figure 2:
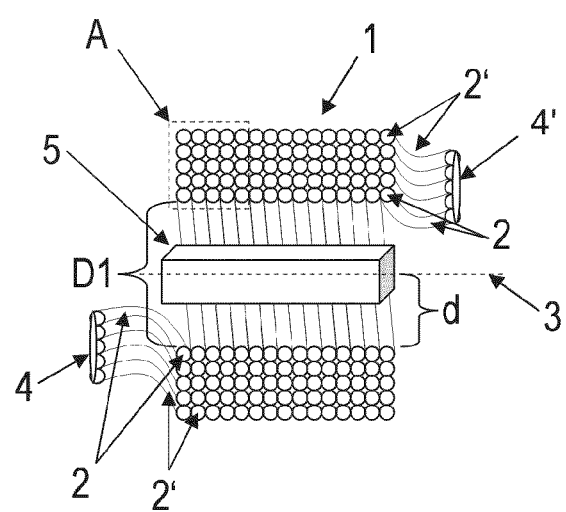
FIG. 2 shows schematically the structure of a winding of a rod core.

FIG. 2 shows a schematic structure of a winding 1 which is used, for example, in the structure of a high-frequency swinging choke according to FIG. 1. Symbolically, only two of the five winding layers are shown. The winding 1 has a plurality of winding layers 2, 2' which are wound around a common winding axis 3. The distance d of the winding layer 2 from the winding axis 3 of the winding 1 is the same over the whole length of the winding 1. The distances from each further winding layer 2' to the winding axis 3 of the winding 1 are likewise approximately constant over the whole length of the winding 1. The winding 1 has an inside diameter D1 which is approximately the same over the whole length of the winding 1. The winding layers 2, 2' of a winding level are preferably arranged uniformly on top of one another. By winding the individual winding layers 2, 2' together, the winding layers 2, 2' come to lie directly on top of one another. The individual winding layers 2, 2' are arranged parallel to one another over the whole length of the winding 1 and are connected in parallel. Electrical contacts 4, 4', with which the individual winding layers 2, 2' are electrically connected to one another, are arranged at the ends of the winding layers 2, 2'. The winding 1 can be electrically connected by means of the electrical contacts 4, 4'. As a result of the turns of the winding layers 2, 2', the winding 1 has sufficient stability for the winding 1 to manage without an additional winding or coil body. A rod core 5 containing ferrite is inserted into the winding axis 3 of the winding 1.

Figure 3:
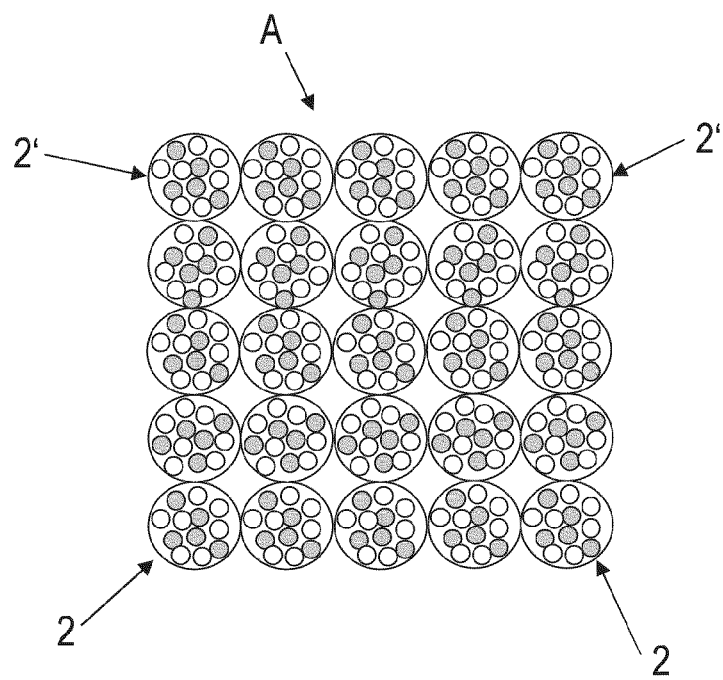
FIG. 3 shows schematically a section of the structure of a winding.

A regional part of the turns, which is shown enlarged in FIG. 3, is marked as region A in FIG. 2.

A section of the winding from FIG. 2 is shown in FIG. 3. The individual winding layers 2, 2' in FIG. 3 each comprise a plurality of stranded wires. Here, each of the stranded wires has approximately 12 individual wires which are twisted against one another. The winding layers 2, 2' can, however, consist of individual wires, rectangular flat wires or some other wire shape. The individual winding layers 2, 2' are arranged exactly on top of one another. The distance of the first winding layer 2 from the winding axis of the winding 1 is approximately the same over the whole length. Further winding layers 2', which are wound together with the first winding layer 2 around a common winding axis, are arranged directly on top of the first winding layer 2.

Figure 4:
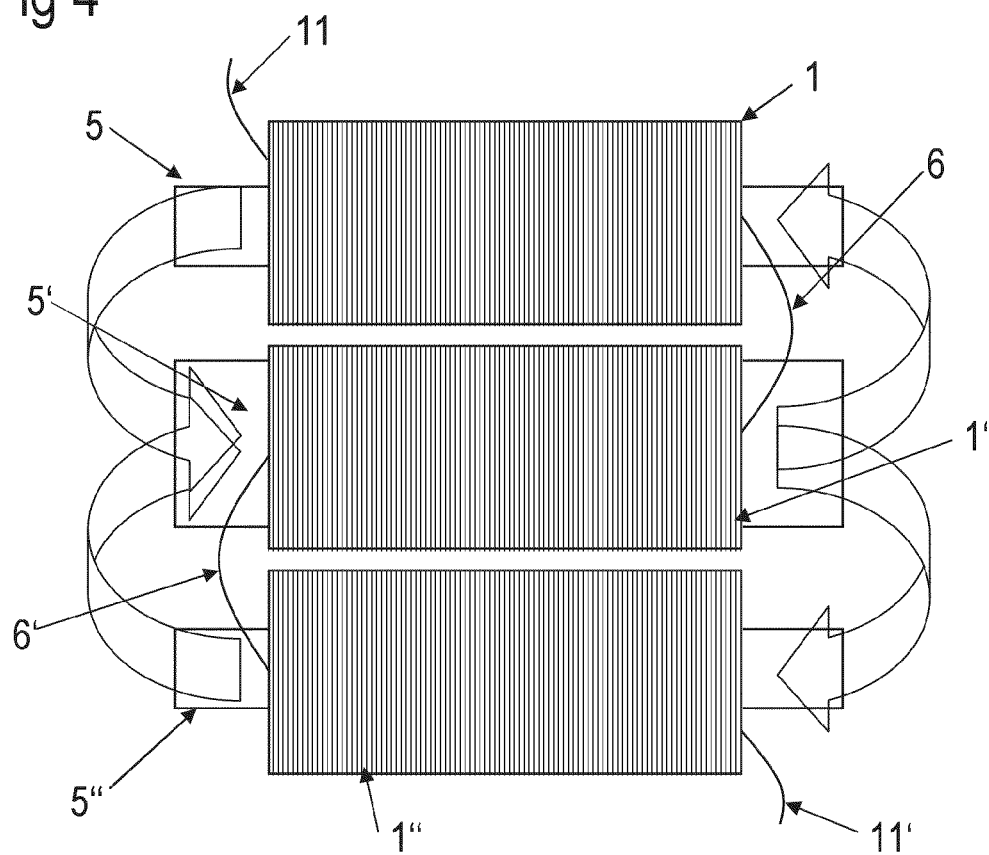
FIG. 4 shows a schematic structure of a further exemplary embodiment of the high-frequency swinging choke with three adjacent rod cores.

FIG. 4 shows the schematic structure of a further embodiment of a high-frequency swinging choke which has three adjacent rod cores 5, 5', 5". The middle rod core 5' has larger dimensions than the outer rod cores 5, 5". The rod cores 5, 5', 5" each have a winding 1, 1', 1". The windings 1, 1', 1" are connected in series by means of wire bridges 6, 6'. The windings 1, 1', 1" of the high-frequency swinging choke are arranged in such a way that two adjacent windings 1, 1', 1" of the high-frequency swinging choke have an opposing winding direction. The magnetic circuit of the top two adjacent rod cores 5, 5' runs in an anticlockwise direction. The magnetic circuit of the middle rod core 5' and the bottom rod core 5" runs in a clockwise direction. In the middle rod core 5', the two magnetic circuits are superimposed. The free winding ends of the winding 1 and the winding 1" which are not connected to the further winding 1' by wire bridges 6, 6' have connecting contacts 11, 11' for making external electrical contact with the high-frequency swinging choke.

Figure 5:
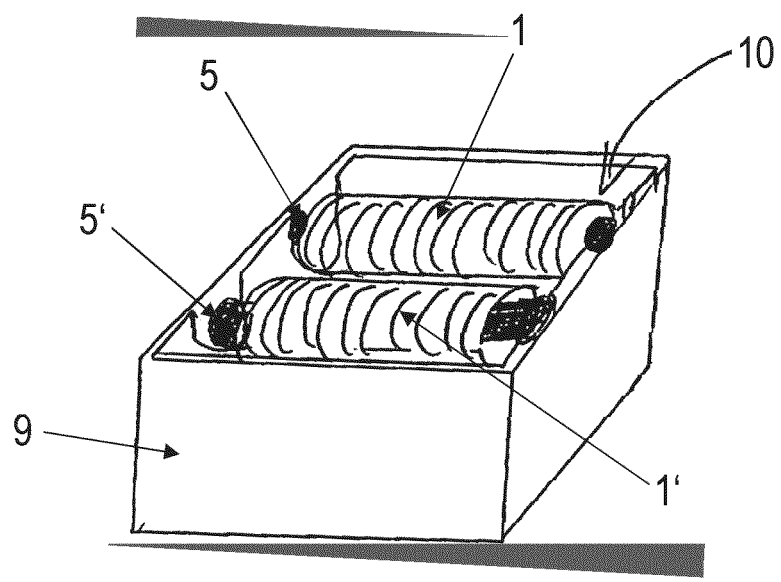
FIG. 5 shows a schematic structure of a device for encapsulating a high-frequency swinging choke with two rod cores.

FIG. 5 shows schematically the structure of a device for encapsulating a high-frequency swinging choke. The device comprises a casting container 9. The casting container 9 has a trough-shaped form. The trough comprises at least four side walls, a bottom and a side which is open at the top. The internal contour 10 of the casting container 9 is the negative of the shape of the encapsulated high high-frequency swinging choke. A high-frequency swinging choke with two rod cores 5, 5' is positioned in the casting container 9. A winding 1, 1' is arranged on each of the rod cores 5, 5'. The rod cores 5, 5' and the windings 1, 1' of the high-frequency swinging choke are held during casting by the casting container 9 and subsequently fixed by the hardened casting compound. The encapsulated high-frequency swinging choke is subsequently removed from the casting container so that a further high-frequency swinging choke can be encapsulated.

Although it has only been possible to describe a limited number of possible improvements of the invention in the exemplary embodiments, the invention is not restricted to these. In principle, it is possible for the high-frequency swinging choke to have a plurality of rod cores and also to comprise a plurality of windings which are spaced from one another on one rod core.

The invention is not restricted to the number of elements shown.

The description of the subject matter specified here is not restricted to the individual special exemplary embodiments, rather the characteristics of the individual embodiments can be combined with one another in any way in so far as this is technically expedient.

The invention claimed is:

1. A high-frequency swinging choke, comprising:
at least two rod cores arranged next to one another in a longitudinal direction, each rod core having at least one winding, wherein the at least one winding of each rod core are connected in series and wherein the swinging choke has a closed magnetic circuit with at least one air gap arranged outside the at least one winding, wherein the at least one air gap is divided into at least two partial air gaps near winding-free ends of the at least two rod cores, wherein the at least two rod cores are arranged such that the winding free ends of the at least two rod cores are spaced apart from each other, wherein a magnetic field of the closed magnetic circuit is guided in the at least two rod cores such that the magnetic field exits from a first winding free end of a first rod core of the at least two rod cores in a first partial air gap and enters from the first partial air gap in a second winding free end of a second rod core of the at least two rod cores.

2. The high-frequency swinging choke according to claim 1, wherein winding directions of the at least one winding of each rod core are aligned in opposition to one another.

3. A method of operating a circuit arrangement that includes a high-frequency swinging choke according to claim 1, the method comprising:
operating the high-frequency swinging choke in an LC series resonant circuit at an nth harmonic of a rectangular oscillation, wherein n is odd and n≥3.

4. The high-frequency swinging choke according to claim 1, wherein the at least two partial air gaps are near the winding-free ends of two adjacent rod cores of the at least two rod cores.

5. The high-frequency swinging choke according to claim 1, wherein part of the at least two rod cores is encompassed by the at least one winding in the longitudinal direction.

6. The high-frequency swinging choke according to claim 5, wherein at least 50% of a length of each of the at least two rod cores are encompassed by the at least one winding.

7. The high-frequency swinging choke according to claim 1, wherein the at least one winding of each rod core has a protective coating made of plastic.

8. The high-frequency swinging choke according to claim 1, wherein the free ends of the at least one winding of each rod core are designed as solder contacts.

9. The high-frequency swinging choke according to claim 1, wherein a maximum flux density of each of the at least two rod cores are at most one third of a saturation magnetization of the at least two rod cores.

10. The high-frequency swinging choke according to claim 1, wherein the at least two rod cores contain ferrite.

11. The high-frequency swinging choke according to claim 1, wherein the at least one winding of each rod core has a plurality of winding layers that are each at a constant distance from a winding axis of the at least one winding of each rod core over an entire length of the windings.

12. The high-frequency swinging choke according to claim 1, wherein the swinging choke is encased with a casting compound.

13. A method for encapsulating a high-frequency swinging choke, the method comprising:
providing the high-frequency swinging choke comprising at least two rod cores arranged next to one another in a longitudinal direction, each rod core having at least one winding, wherein the at least one winding of each rod core are connected in series, wherein the swinging choke has a closed magnetic circuit with at least one air gap arranged outside the at least one winding of each rod core, wherein the at least one air gap is divided into at least two partial air gaps near winding-free ends of the at least two rod cores, wherein the at least two rod cores are arranged such that the winding free ends of the at least two rod cores are spaced apart from each other, wherein a magnetic field of the closed magnetic circuit is guided in the at least two rod cores such that the magnetic field exits from a first winding free end of a first rod core of the at least two rod cores in a first partial air gap and enters from the first partial air gap in a second winding free end of a second rod core of the at least two rod cores; and
fixing the at least two rod cores and the at least one winding of each rod core of the high-frequency swinging choke in a casting container.

14. The method according to claim 13, wherein the swinging choke is encapsulated by the casting container.

15. The method according to claim 14, wherein the casting container has an internal contour that determines an external shape of the encapsulated swinging choke.

16. A high-frequency swinging choke, comprising:
at least two rod cores arranged next to one another in a longitudinal direction, each rod core having at least one winding, wherein the at least one winding of each rod core are connected in series and wherein a maximum flux density of the at least two rod cores is at most one third of a saturation magnetization of the at least two rod cores.

17. The high-frequency swinging choke according to claim 16, wherein the swinging choke has a magnetic circuit with at least one air gap.

18. The high-frequency swinging choke according to claim 16, wherein the swinging choke is encased with a casting compound.

19. The high-frequency swinging choke according to claim 16, wherein the at least two rod cores contain ferrite.

20. The high-frequency swinging choke according to claim 16, wherein the at least one winding of each rod core has a plurality of winding layers that are each at a constant distance from a winding axis of the at least one winding of each rod core over an entire length of the at least one winding of each rod core.

* * * * *